(12) United States Patent
Yang et al.

(10) Patent No.: US 8,277,956 B2
(45) Date of Patent: Oct. 2, 2012

(54) ORGANIC LIGHT EMITTING DIODE

(75) Inventors: Seung-Gak Yang, Yongin (KR); Hee-Yeon Kim, Yongin (KR); Jae-Yong Lee, Yongin (KR); Jong Hyuk Lee, Yongin (KR)

(73) Assignee: Samsung Mobile Display Co., Ltd., Nongseo-Dong, Giheung-Gu, Yongin, Gyunggi-Do (KR)

( * ) Notice: Subject to any disclaimer, the term of this patent is extended or adjusted under 35 U.S.C. 154(b) by 512 days.

(21) Appl. No.: 12/461,546

(22) Filed: Aug. 14, 2009

(65) Prior Publication Data

US 2010/0038633 A1   Feb. 18, 2010

(30) Foreign Application Priority Data

Aug. 18, 2008   (KR) .................. 10-2008-0080569

(51) Int. Cl.
*H01L 51/54* (2006.01)

(52) U.S. Cl. ........ 428/690; 428/917; 313/504; 313/506; 313/512; 257/40

(58) Field of Classification Search .................. None
See application file for complete search history.

(56) References Cited

U.S. PATENT DOCUMENTS

| | | | | |
|---|---|---|---|---|
| 4,356,429 A * | 10/1982 | Tang | | 313/503 |
| 5,278,204 A | 1/1994 | Tojo et al. | | |
| 5,409,783 A * | 4/1995 | Tang et al. | | 428/690 |
| 5,446,141 A | 8/1995 | Itoh et al. | | |
| 5,972,247 A * | 10/1999 | Shi et al. | | 252/583 |
| 6,278,236 B1 * | 8/2001 | Madathil et al. | | 313/504 |
| 6,579,629 B1 * | 6/2003 | Raychaudhuri et al. | | 428/690 |
| 7,919,770 B2 * | 4/2011 | Youngblood et al. | | 257/40 |
| 2002/0015818 A1 * | 2/2002 | Takahashi et al. | | 428/76 |
| 2003/0044640 A1 * | 3/2003 | Funahashi et al. | | 428/690 |
| 2004/0043247 A1 * | 3/2004 | Lee et al. | | 428/690 |
| 2004/0056244 A1 * | 3/2004 | Marcus et al. | | 257/40 |
| 2009/0072718 A1 * | 3/2009 | Nomura et al. | | 313/504 |

FOREIGN PATENT DOCUMENTS

| | | | |
|---|---|---|---|
| JP | 03-028291 | * | 2/1991 |
| JP | 11251062 A | | 9/1999 |
| JP | 11329742 A | | 11/1999 |
| JP | 11-345687 | * | 12/1999 |
| KR | 19910005874 | | 8/1991 |
| KR | 19910006770 | | 9/1991 |
| WO | WO 2009/056626 | * | 5/2009 |

OTHER PUBLICATIONS

Lobbert, G. 2000. Phthalocyanines. Ullmann's Encyclopedia of Industrial Chemistry.*
Journal of Physical Chemistry B (2003), 107(5), pp. 1142-1150.*
Synthetic Metals, (1999), 105(2), pp. 145-149.*
Korean Office Action issued by Korean Patent Office on May 25, 2010 corresponding Korean Patent Application No. 10-2008-0080569 and Request for Entry of the Accompanying Office Action attached herewith.

* cited by examiner

*Primary Examiner* — Dawn L. Garrett
(74) *Attorney, Agent, or Firm* — Robert E. Bushnell, Esq.

(57) ABSTRACT

Provided is an organic light emitting diode including: a first electrode; a second electrode; an organic layer between the first electrode and the second electrode; and a luminous efficiency improvement layer disposed on a surface of the first electrode facing away from the organic layer or a surface of the second electrode facing away from the organic layer, wherein the luminous efficiency improvement layer includes a porphyrazin derivative, a phthalocyanine derivative, a naphthalocyanine derivative, or a combination of at least two compounds of the foregoing.

20 Claims, 2 Drawing Sheets

| 200a |
|:---:|
| 300 |
| 400 |
| 500 |
| 200b |
| 600 |

ORGANIC LIGHT EMITTING DIODE

CROSS-REFERENCE TO RELATED PATENT APPLICATIONS

This application claims the benefit of Korean Patent Application No. 10-2008-0080569, filed on Aug. 18, 2008, in the Korean Intellectual Property Office, the disclosure of which is incorporated herein in its entirety by reference.

BACKGROUND OF THE INVENTION

1. Field of the Invention

The present inventive concept relates to an organic light emitting diode, and more particularly, to an organic light emitting diode.

2. Description of the Related Art

Light emitting diodes are self-emission devices that have wide viewing angles, high contrast ratios, and short response time Light emitting diodes can be categorized into inorganic light omitting diodes and organic light emitting diodes (OLEDs) according to an emitting layer forming material. OLEDs are better than inorganic light emitting diodes in terms of luminosity, driving voltage, and response speed. In addition, OLEDs can generate natural colors.

In general, an OLED includes a substrate, an anode disposed on the substrate, and a hole transport layer, an emitting layer, an electron transport layer and a cathode which are sequentially disposed on the anode. The hole transport layer, the emitting layer, and the electron transport layer are organic thin films.

An exemplary driving principle of the organic light emitting diode is as follows.

When a voltage is applied between the anode and the cathode, holes injected through the anode move to the emitting layer through the hole transport layer and electrons injected through the cathode move to the emitting layer through the electron transport layer. Carriers, such as holes and electrons, are re-combined in the emitting layer to form excitons. The excitons are changed from an excited state to a ground state and thus, fluorescent molecules in the emitting layer are excited, thereby emitting light.

However, conventional OLEDs have undesirable driving voltage, luminosity, current density, power efficiency, and lifetime characteristics. Accordingly, there is a need to improve these characteristics of OLEDs.

SUMMARY OF THE INVENTION

One or more embodiments include an organic light emitting diode (OLED) having high luminous efficiency.

According to an aspect of the present inventive concept, there is provided an organic light emitting diode including: a substrate; a first electrode disposed on the substrate, the first electrode having a first surface facing the substrate and a second surface opposite to the first surface of the first electrode; an organic layer disposed on the first electrode; a second electrode disposed on the organic layer, the second electrode having a first surface facing the organic layer and a second surface opposite to the first surface of the second electrode; and a luminous efficiency improvement layer disposed on at least one surface of the first surface of the first electrode and the second surface of the second electrodes, the luminous efficiency improvement layer comprising a compound selected from the group consisting of a porphyrazin derivative, a phthalocyanine derivative, a naphthalocyanine derivative, and combinations of at least two compounds of the foregoing.

According to an embodiment of the present inventive concept, the porphyrazin derivative may be represented by Formula 1:

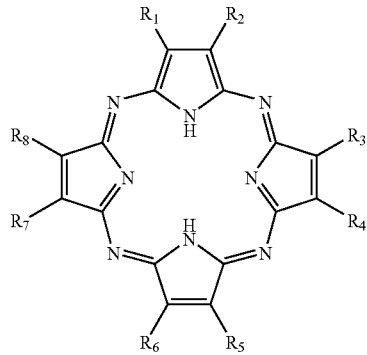

[Formula 1]

where $R_1$ through $R_8$ are each independently a hydrogen atom, a halogen atom, a hydroxyl group, a cyano group, a substituted or unsubstituted $C_1$-$C_{30}$ alkyl group, a substituted or unsubstituted $C_1$-$C_{30}$ alkoxy group, a substituted or unsubstituted $C_1$-$C_{30}$ acyl group, a substituted or unsubstituted $C_2$-$C_{30}$ alkenyl group, a substituted or unsubstituted $C_2$-$C_{30}$ alkynyl group, a substituted or unsubstituted $C_6$-$C_{30}$ aryl group, or a substituted or unsubstituted $C_3$-$C_{30}$ hetero aryl group.

According to an embodiment of the present inventive concept, the $R_1$ through $R_8$ of Formula 1 are each independently a hydrogen atom, a halogen atom, a hydroxyl group, a cyano group, a substituted or unsubstituted $C_1$-$C_{10}$ alkyl group, a substituted or unsubstituted $C_1$-$C_{10}$ alkoxy group, a substituted or unsubstituted $C_1$-$C_{10}$ acyl group, a substituted or unsubstituted $C_2$-$C_{10}$ alkenyl group, a substituted or unsubstituted $C_2$-$C_{10}$ alkynyl group, a substituted or unsubstituted $C_6$-$C_{10}$ aryl group, or a substituted or unsubstituted $C_3$-$C_{10}$ hetero aryl group.

According to an embodiment of the present inventive concept, the phthalocyanine derivative may be represented by Formula 2:

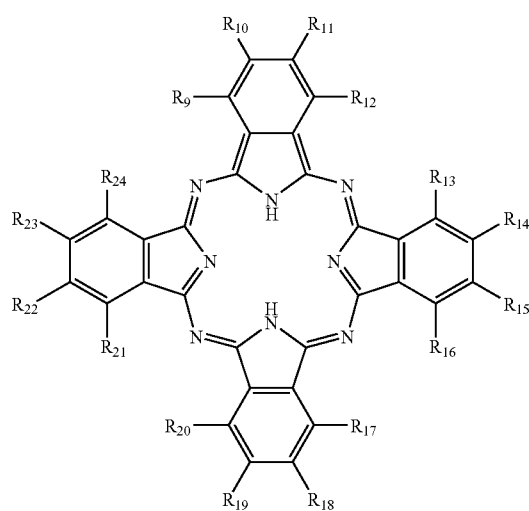

[Formula 2]

where $R_9$ through $R_{24}$ are each independently a hydrogen atom, a halogen atom, a hydroxyl group, a cyano group, a substituted or unsubstituted $C_1$-$C_{30}$ alkyl group, a substituted or unsubstituted $C_1$-$C_{30}$ alkoxy group, a substituted or unsubstituted $C_1$-$C_{30}$ acyl group, a substituted or unsubstituted $C_2$-$C_{30}$ alkenyl group, a substituted or unsubstituted $C_2$-$C_{30}$ alkynyl group, a substituted or unsubstituted $C_6$-$C_{30}$ aryl group, or a substituted or unsubstituted $C_3$-$C_{30}$ hetero aryl group.

According to an embodiment of the present inventive concept, $R_9$ through $R_{24}$ of Formula 2 are each independently a hydrogen atom, a halogen atom, a hydroxyl group, a cyano group, a substituted or unsubstituted $C_1$-$C_{10}$ alkyl group, a substituted or unsubstituted $C_1$-$C_{10}$ alkoxy group, a substituted or unsubstituted $C_1$-$C_{10}$ acyl group, a substituted or unsubstituted $C_2$-$C_{10}$ alkenyl group, a substituted or unsubstituted $C_2$-$C_{10}$ alkynyl group, a substituted or unsubstituted $C_6$-$C_{10}$ aryl group, or a substituted or unsubstituted $C_3$-$C_{10}$ hetero aryl group.

According to an embodiment of the present inventive concept, the naphthalocyanine derivative may be represented by Formula 3:

[Formula 3]

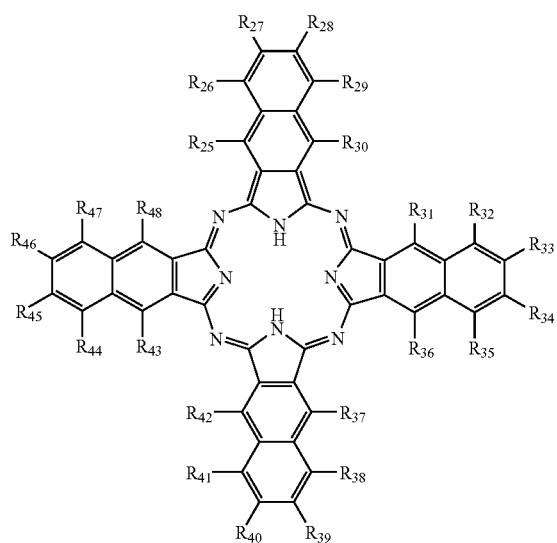

where $R_{25}$ through $R_{48}$ are each independently a hydrogen atom, a halogen atom, a hydroxyl group, a cyano group, a substituted or unsubstituted $C_1$-$C_{30}$ alkyl group, a substituted or unsubstituted $C_1$-$C_{30}$ alkoxy group, a substituted or unsubstituted $C_1$-$C_{30}$ acyl group, a substituted or unsubstituted $C_2$-$C_{30}$ alkenyl group, a substituted or unsubstituted $C_2$-$C_{30}$ alkynyl group, a substituted or unsubstituted $C_6$-$C_{30}$ aryl group, or a substituted or unsubstituted $C_3$-$C_{30}$ hetero aryl group, wherein two or more neighboring substituents selected from $R_{25}$ through $R_{48}$ may be bound to each other to form a saturated or unsaturated ring.

According to an embodiment of the present inventive concept, $R_{25}$ through $R_{48}$ of Formula 3 are each independently a hydrogen atom, a halogen atom, a hydroxyl group, a cyano group, a substituted or unsubstituted $C_1$-$C_{10}$ alkyl group, a substituted or unsubstituted $C_1$-$C_{10}$ alkoxy group, a substituted or unsubstituted $C_1$-$C_{10}$ acyl group, a substituted or unsubstituted $C_2$-$C_{10}$ alkenyl group, a substituted or unsubstituted $C_2$-$C_{10}$ alkynyl group, a substituted or unsubstituted $C_6$-$C_{10}$ aryl group, or a substituted or unsubstituted $C_3$-$C_{10}$ hetero aryl group.

According to an embodiment of the present inventive concept, the porphyrazin derivative may be one or more compounds selected from the compounds represented by Formulae 4 through 7:

[Formula 4]

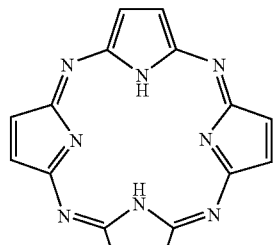

[Formula 5]

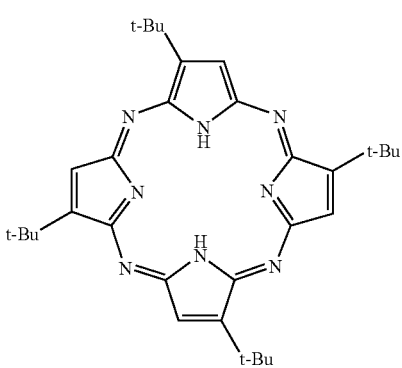

[Formula 6]

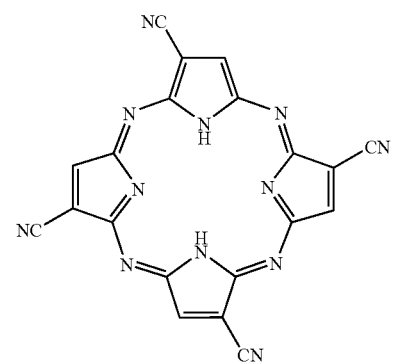

[Formula 7]

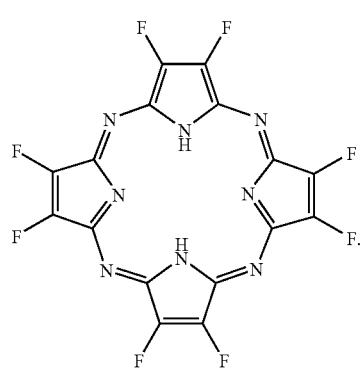

According to an embodiment of the present inventive concept, the phthalocyanine derivative may be one or more compounds selected from the compounds represented by Formulae 8 through 13:

[Formula 8]
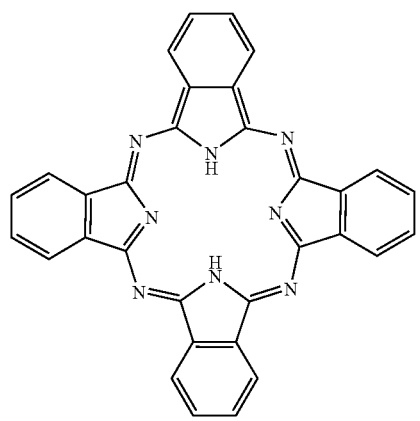
[Formula 9]
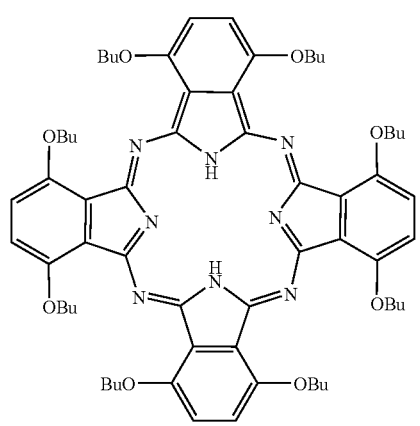
[Formula 10]
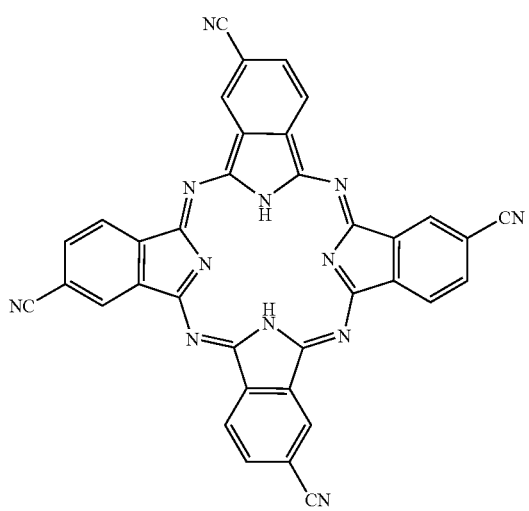
[Formula 11]
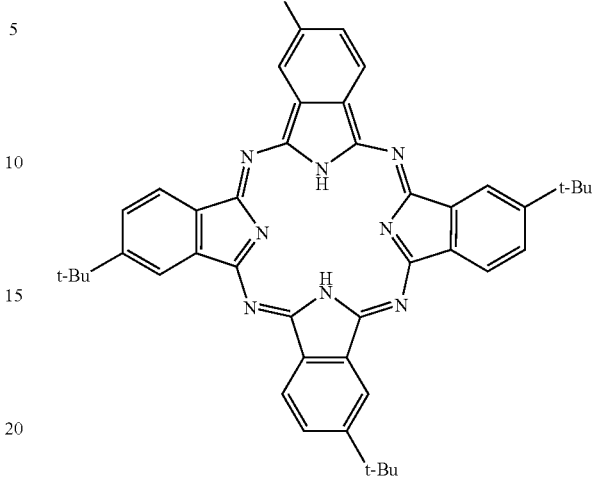
[Formula 12]
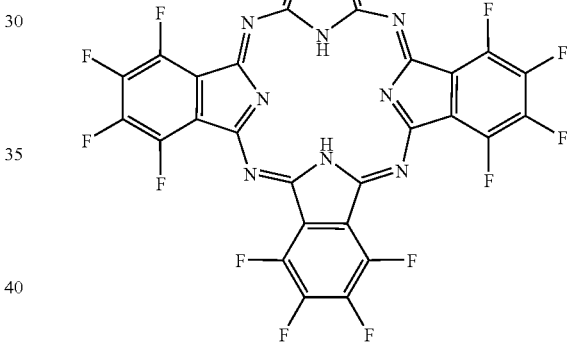
[Formula 13]
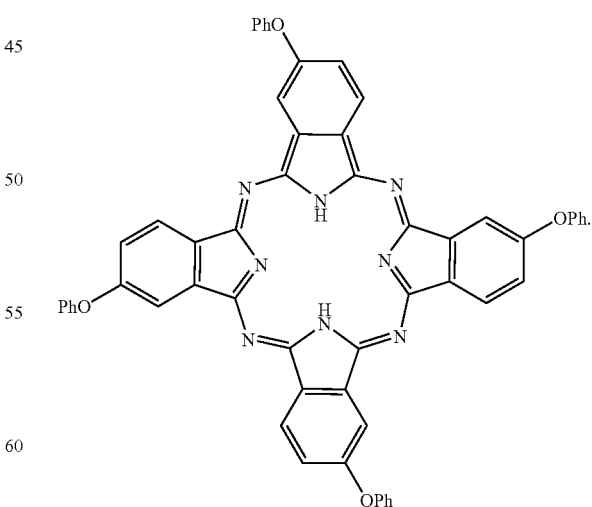
According to an embodiment of the present inventive concept, the naphthalocyanine derivative may be one or more compounds selected from the compounds 14 through 17:

[Formula 14]

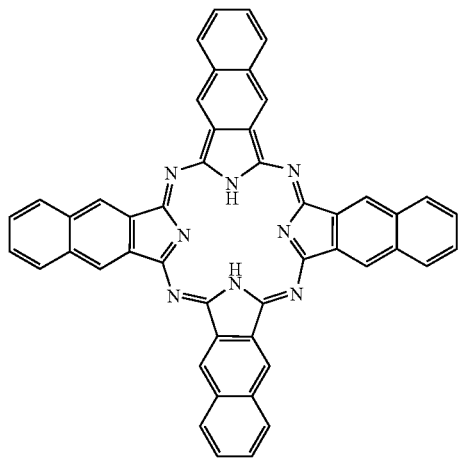

[Formula 15]

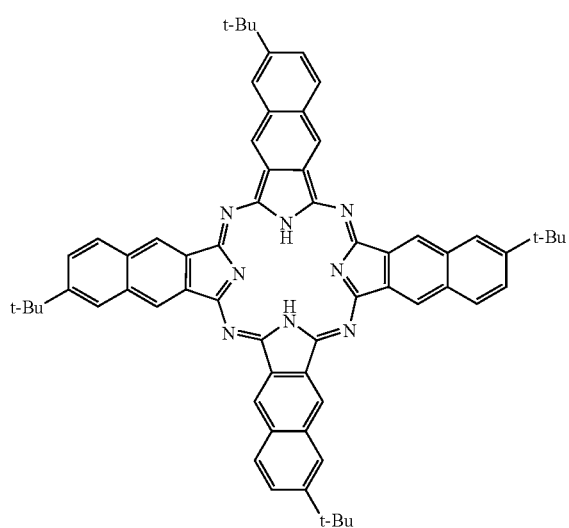

[Formula 16]

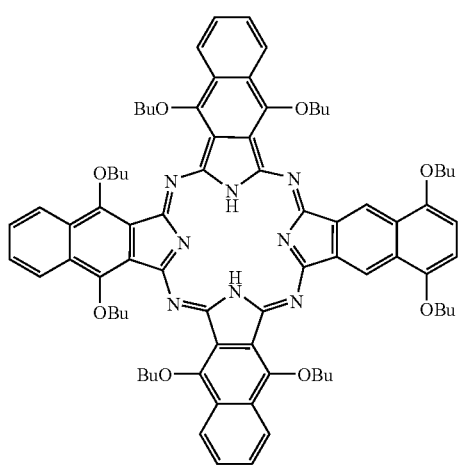

[Formula 17]

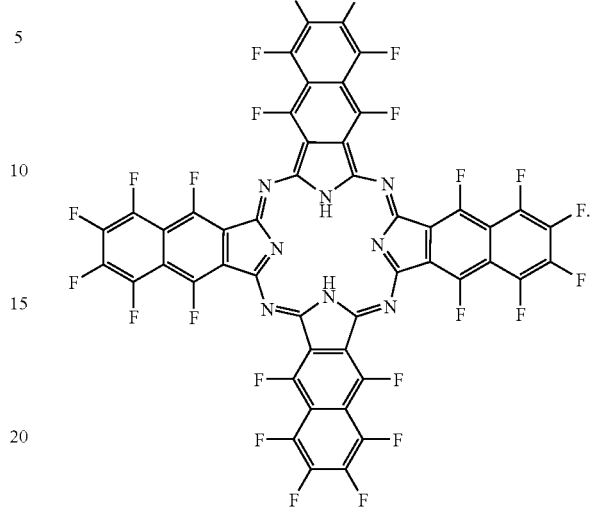

According to an embodiment of the present inventive concept, the first electrode may be a reflective electrode and the second electrode is a transmissive electrode.

According to an embodiment of the present inventive concept, the second electrode is a reflective electrode and the first electrode may be a transmissive electrode.

According to an embodiment of the present inventive concept, the first electrode and the second electrode may be transmissive electrodes.

According to an embodiment of the present inventive concept, the organic layer may be independently patterned according to R, G, and B pixels.

According to an embodiment of the present inventive concept, the luminous efficiency improvement layer may be formed on at least one region selected from regions corresponding to R, G, and B pixels.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1:
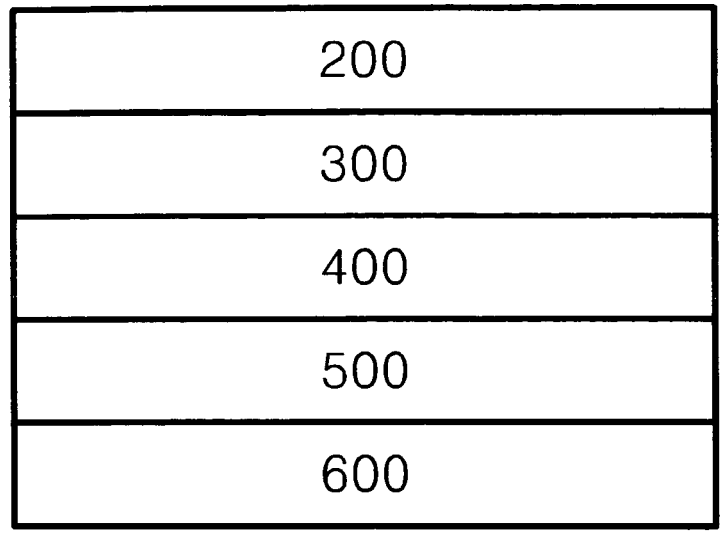
FIG. 1 is a sectional view of a top emission-type organic light emitting diode (OLED) according to an embodiment of the present inventive concept.

The present inventive concept will now be described more fully with reference to the accompanying drawings, in which exemplary embodiments of the invention are shown.

An organic light emitting diode (OLED) according to an embodiment of the present inventive concept includes a substrate; a first electrode disposed on the substrate; a second electrode facing the first electrode; an organic layer disposed between the first electrode and the second electrode; and a luminous efficiency improvement layer disposed on at least one surface selected from surfaces, facing away from the organic layer, of the first electrode and the second electrode. That is, when a surface of the first electrode facing the substrate is referred to as a first surface of the first electrode, a surface of the first electrode opposite to the first surface of the first electrode (i.e., facing the organic layer) is referred to as a second surface of the first electrode, a surface of the second electrode facing the organic layer is referred to as a first surface of the second electrode, a surface of the second electrode opposite to the first surface of the second electrode is referred to as a second surface of the second electrode, the luminous efficiency improvement layer may be disposed on the first surface of the first electrode, on the second surface of the second electrode, or both on the first surface of the first electrode and on the second surface of the second electrode. The luminous efficiency improvement layer includes a porphyrazin derivative, a phthalocyanine derivative, a naphthalocyanine derivative, or a combination of at least one compound of the foregoing.

The porphyrazin derivative may be represented by Formula 1:

[Formula 1]

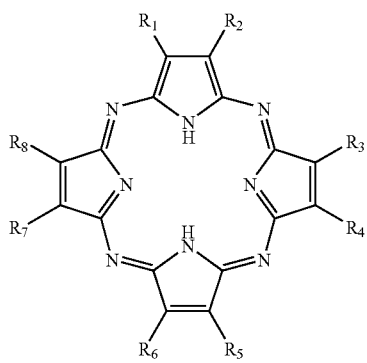

where $R_1$ through $R_8$ are each independently a hydrogen atom, a halogen atom, a hydroxyl group, a cyano group, a substituted or unsubstituted $C_1$-$C_{30}$ alkyl group, a substituted or unsubstituted $C_1$-$C_{30}$ alkoxy group, a substituted or unsubstituted $C_1$-$C_{30}$ acyl group, a substituted or unsubstituted $C_2$-$C_{30}$ alkenyl group, a substituted or unsubstituted $C_2$-$C_{30}$ alkynyl group, a substituted or unsubstituted $C_6$-$C_{30}$ aryl group, or a substituted or unsubstituted $C_3$-$C_{30}$ hetero aryl group. Two or more neighboring substituents selected from $R_1$ through $R_8$ may be bound to each other to form a saturated or unsaturated ring. In an embodiment, $R_1$ through $R_8$ of Formula 1 may be each independently a hydrogen atom, a halogen atom, a hydroxyl group, a cyano group, a substituted or unsubstituted $C_1$-$C_{10}$ alkyl group, a substituted or unsubstituted $C_1$-$C_{10}$ alkoxy group, a substituted or unsubstituted $C_1$-$C_{10}$ acyl group, a substituted or unsubstituted $C_2$-$C_{10}$ alkenyl group, a substituted or unsubstituted $C_2$-$C_{10}$ alkynyl group, a substituted or unsubstituted $C_6$-$C_{10}$ aryl group, or a substituted or unsubstituted $C_3$-$C_{10}$ hetero aryl group.

The phthalocyanine derivative may be represented by Formula 2:

[Formula 2]

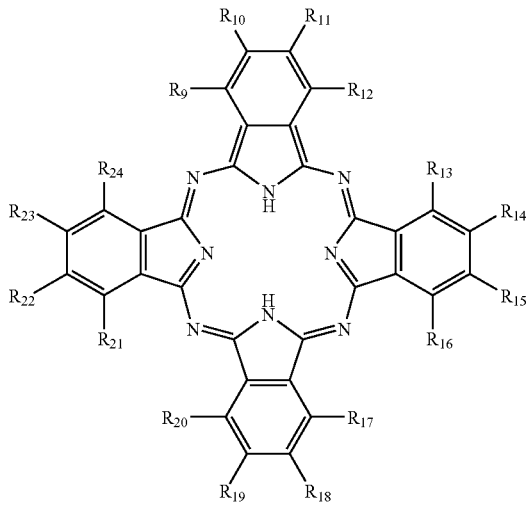

where $R_9$ through $R_{24}$ are each independently a hydrogen atom, a halogen atom, a hydroxyl group, a cyano group, a substituted or unsubstituted $C_1$-$C_{30}$ alkyl group, a substituted or unsubstituted $C_1$-$C_{30}$ alkoxy group, a substituted or unsubstituted $C_1$-$C_{30}$ acyl group, a substituted or unsubstituted $C_2$-$C_{30}$ alkenyl group, a substituted or unsubstituted $C_2$-$C_{30}$ alkynyl group, a substituted or unsubstituted $C_6$-$C_{30}$ aryl group, or a substituted or unsubstituted $C_3$-$C_{30}$ hetero aryl group. Two or more neighboring substituents selected from $R_9$ through $R_{24}$ may be bound to each other to form a saturated or unsaturated ring. In an embodiment, $R_9$ through $R_{24}$ of Formula 2 may be each independently a hydrogen atom, a halogen atom, a hydroxyl group, a cyano group, a substituted or unsubstituted $C_1$-$C_{10}$ alkyl group, a substituted or unsubstituted $C_1$-$C_{10}$ alkoxy group, a substituted or unsubstituted $C_1$-$C_{10}$ acyl group, a substituted or unsubstituted $C_2$-$C_{10}$ alkenyl group, a substituted or unsubstituted $C_2$-$C_{10}$ alkynyl group, a substituted or unsubstituted $C_6$-$C_{10}$ aryl group, or a substituted or unsubstituted $C_3$-$C_{10}$ hetero aryl group.

The naphthalocyanine derivative may be represented by Formula 3:

[Formula 3]

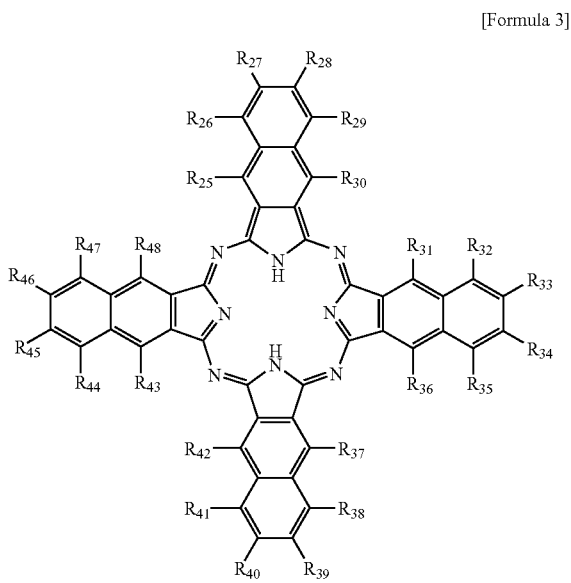

where $R_{25}$ through $R_{48}$ are each independently a hydrogen atom, a halogen atom, a hydroxyl group, a cyano group, a substituted or unsubstituted $C_1$-$C_{30}$ alkyl group, a substituted or unsubstituted $C_1$-$C_{30}$ alkoxy group, a substituted or unsubstituted $C_1$-$C_{30}$ acyl group, a substituted or unsubstituted $C_2$-$C_{30}$ alkenyl group, a substituted or unsubstituted $C_2$-$C_{30}$ alkynyl group, a substituted or unsubstituted $C_6$-$C_{30}$ aryl group, or a substituted or unsubstituted $C_3$-$C_{30}$ hetero aryl group, wherein two or more neighboring substituents selected from $R_{25}$ through $R_{48}$ may bind to each other to form a saturated or unsaturated ring. In an embodiment, $R_{25}$ through $R_{48}$ of Formula 3 may be each independently a hydrogen atom, a halogen atom, a hydroxyl group, a cyano group, a substituted or unsubstituted $C_1$-$C_{10}$ alkyl group, a substituted or unsubstituted $C_1$-$C_{10}$ alkoxy group, a substituted or unsubstituted $C_1$-$C_{10}$ acyl group, a substituted or unsubstituted $C_2$-$C_{10}$ alkenyl group, a substituted or unsubstituted $C_2$-$C_{10}$ alkynyl group, a substituted or unsubstituted $C_6$-$C_{10}$ aryl group, or a substituted or unsubstituted $C_3$-$C_{10}$ hetero aryl group.

Hereinafter, substituents described with reference to Formulae 1-3 will now be described in detail.

In Formulae 1-3, examples of the unsubstituted $C_1$-$C_{30}$ alkyl group include methyl, ethyl, propyl, isobutyl, sec-butyl, pentyl, iso-amyl, and hexyl. Examples of the substituted $C_1$-$C_{30}$ alkyl group include $C_1$-$C_{30}$ alkyl group of which one or more hydrogen atoms are substituted with one or more substituents such as a halogen atom, a substituted or unsubstituted $C_6$-$C_{12}$ aryl group, a substituted or unsubstituted $C_1$-$C_{30}$ alkyl group, a substituted or unsubstituted $C_1$-$C_{30}$ alkoxy group, a low alkylamino group, a hydroxyl group, a nitro group, a cyano group, an amino group, an amidino group, hydrazine, hydrazone, a carboxylic group, a sulfonic acid group, and a phosphoric acid group.

In Formulae 1-3, examples of the unsubstituted $C_1$-$C_{30}$ alkoxy group include methoxy, ethoxy, propoxy, isobutyloxy, sec-butyloxy, pentyloxy, iso-amyloxy, and hexyloxy. Examples of the substituted $C_1$-$C_{30}$ alkoxy group include $C_1$-$C_{30}$ alkoxy group of which one or more hydrogen atoms are substituted with one or more substituents that have been described with the unsubstituted $C_1$-$C_{30}$ alkyl group.

In Formulae 1-3, examples of the unsubstituted $C_1$-$C_{30}$ acyl group include an acetyl group, a benzoyl group, and a propionyl group. Examples of the substituted $C_1$-$C_{30}$ acyl group include $C_1$-$C_{30}$ acyl group of which one or more hydrogen atoms are substituted with one or more substituents that have been described with the unsubstituted $C_1$-$C_{30}$ alkyl group.

In Formulae 1-3, examples of the unsubstituted $C_2$-$C_{30}$ alkenyl group include stylene, propylene, and allene. Examples of the substituted $C_2$-$C_{30}$ alkenyl group include $C_2$-$C_{30}$ alkenyl group of which one or more hydrogen atoms are substituted with one or more substituents that have been described with the unsubstituted $C_1$-$C_{30}$ alkyl group.

In Formulae 1-3, examples of the unsubstituted $C_2$-$C_{30}$ alkynyl group include acetylene and phenyl acetylene. Examples of the substituted $C_2$-$C_{30}$ alkynyl group include $C_2$-$C_{30}$ alkynyl group of which one or more hydrogen atoms are substituted with one or more substituents that have been described with the unsubstituted $C_1$-$C_{30}$ alkyl group.

In Formulae 1-3, the $C_6$-$C_{30}$ aryl group refers to a carbocyclic aromatic system including one or more ring. When the $C_6$-$C_{30}$ aryl group in Formula 1 includes two or more rings, these rings may be pendent to or fused with each other to form an asymmetric porphyrazin derivative. The term 'aryl' refers to a functional group of, or derived from, an aromatic ring including, but not limited to, phenyl, naphthyl, or anthracenyl. In the aryl, one or more hydrogen atom may be substituted with the substituents that have been described with the unsubstituted $C_1$-$C_{30}$ alkyl group.

In Formulae 1-3, the $C_2$-$C_{30}$ hetero aryl group refers to a monovalent monocyclic ring compound having 2-30 ring atoms, wherein one, two, or three hetero atoms are selected from N, O, P and S, and the other atoms are carbons (C). When the $C_2$-$C_{30}$ hetero aryl group has two or more rings, these rings may be pendent to or fused with each other to form an asymmetric porphyrazin derivative. Examples of the hetero aryl group include, but not limited to, pyridyl, thienyl, and furyl. In the hetero aryl group, one or more hydrogen atoms may be substituted with one or more substituents that have been described with the unsubstituted $C_1$-$C_{30}$ alkyl group.

In an embodiment, the porphyrazin derivative represented by Formula 1 may be selected from compounds represented by Formulae 4-7 illustrated below, but is not limited thereto:

[Formula 4]

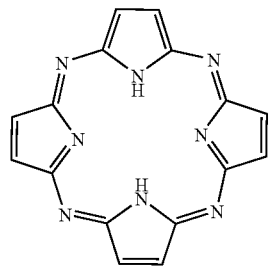

[Formula 5]

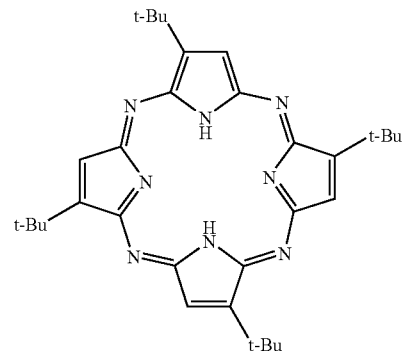

[Formula 6]

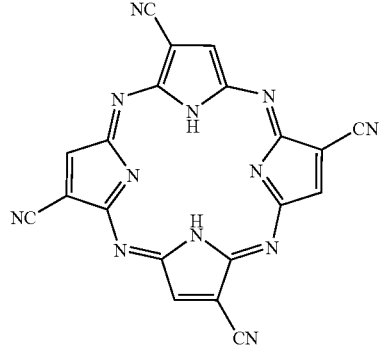

[Formula 7]

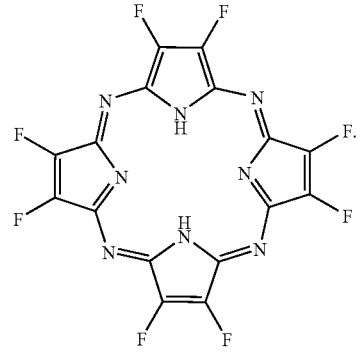

The phthalocyanine derivative represented by Formula 2 may be selected from compounds represented by Formulae 8-13, but is not limited thereto:
[Formula 8]
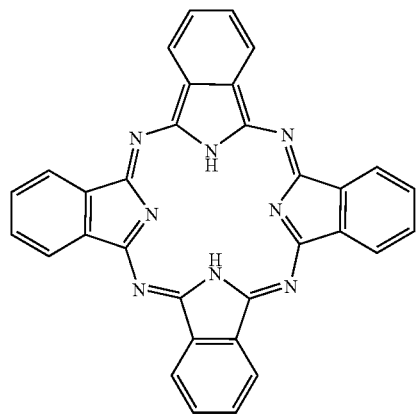
[Formula 9]
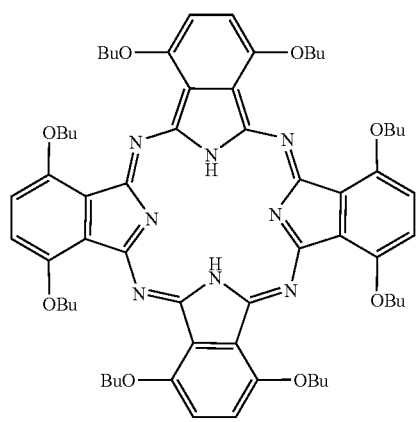
[Formula 10]
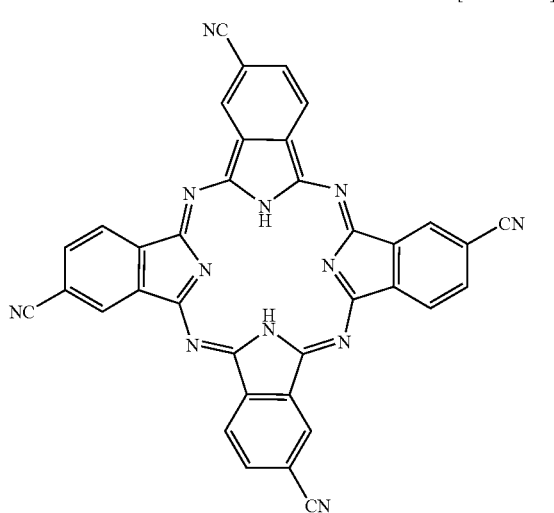
[Formula 11]
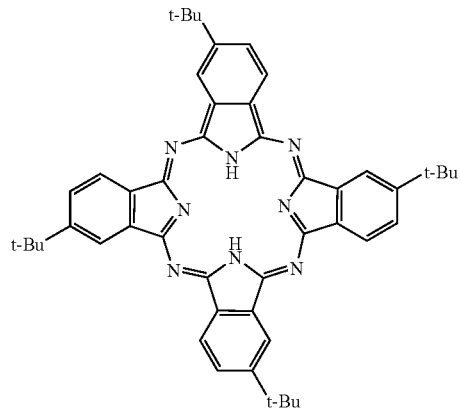
[Formula 12]
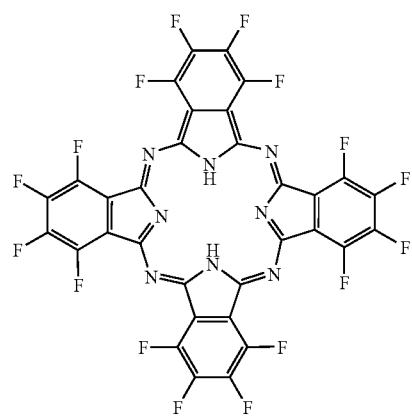
[Formula 13]
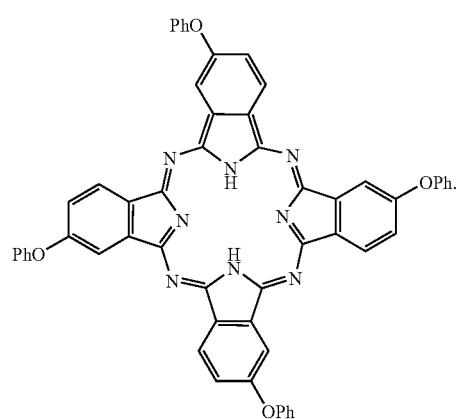
The naphthalocyanine derivative represented by Formula 3 may be any one compound selected from Compounds 14 to 17, but is not limited thereto.

[Formula 14]

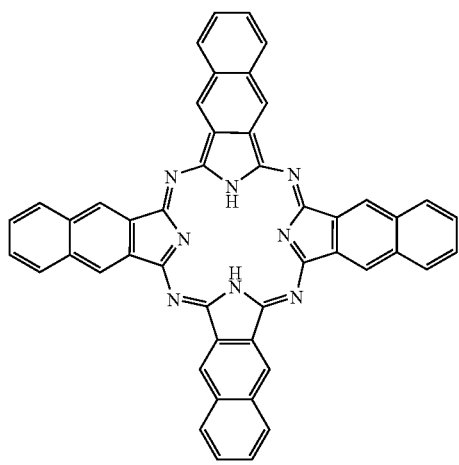

[Formula 15]

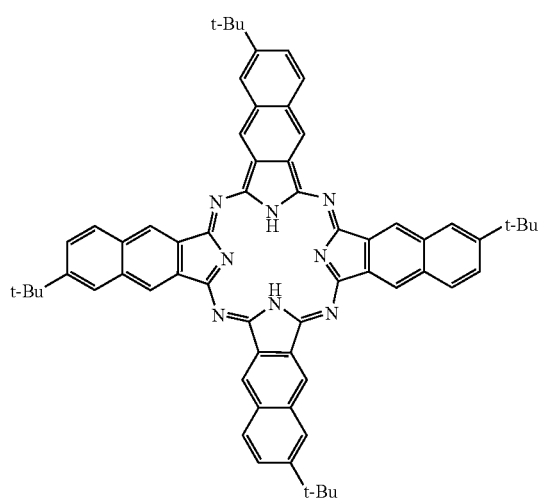

[Formula 16]

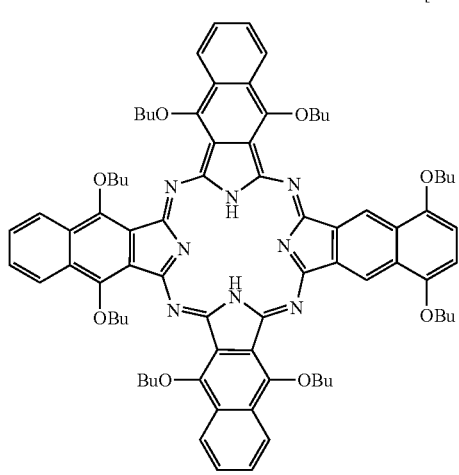

[Formula 17]

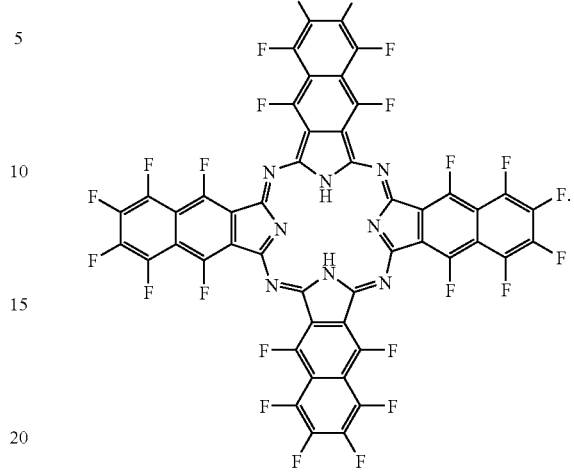

According to an embodiment of the present inventive concept, a first electrode may be a reflective electrode and a second electrode may be a transmissive electrode. The transmissive electrode may be formed of, for example, ITO or IZO.

In the case of such a top emission-type OLED, when a luminous efficiency improvement layer formed of at least one compound selected from the compounds represented by Formulae 4-7 or a combination of at least two compounds of the foregoing is disposed on the second electrode, the luminous efficiency improvement layer has a refraction index of 1.4 to 2.5, specifically 1.7 to 2.5. Accordingly, light having the same luminosity can be more efficiently emitted outside the top emission-type OLED, and the luminous efficiency and lifetime characteristics of the top emission-type OLED are improved.

According to an embodiment of the present inventive concept, a second electrode may be a reflective electrode and a first electrode may be a transmissive electrode. The transmissive electrode may be formed of, for example, ITO or IZO.

For such a bottom emission-type OLED, a luminous efficiency improvement layer can include a porphyrazin derivative, a phthalocyanine derivative, a naphthalocyanine derivative, or a combination of at least two compounds of the foregoing. Examples of the porphyrazin derivative, the phthalocyanine derivative, the naphthalocyanine derivative have been already described above.

When the luminous efficiency improvement layer is disposed on the first electrode of the bottom emission-type OLED, the luminous efficiency improvement layer may have a refraction index of 1.4 to 2.5, specifically 1.7 to 2.5. In this case, light having the same luminosity can be more efficiently emitted outside the top emission-type OLED, and the luminous efficiency and lifetime characteristics of the bottom emission-type OLED are improved.

According to an embodiment of the present inventive concept, both the first electrode and the second electrode may be transmissive electrodes.

When both the first electrode and the second electrode are transmissive electrodes, a luminous efficiency improvement layer may be disposed on the first surface of the first electrode, on the second surface of the second electrode, or on each of the first surface of the first electrode and on the second surface of the second electrode.

When a luminous efficiency improvement layer is disposed on each of the first surface of the first electrode and the second surface of the second electrode of such a both-direction light emission-type OLED, each of the luminous efficiency improvement layer may have a refraction index of 1.4 to 2.5, specifically 1.7 to 2.5.

Each of the luminous efficiency improvement layers can include a porphyrazin derivative, a phthalocyanine derivative, a naphthalocyanine derivative, or a combination of at least two compounds of the foregoing. The material of the luminous efficiency improvement layers may be the same or different from each other.

In this case, light having the same luminosity can be more efficiently emitted outside the top emission-type OLED, and the luminous efficiency and lifetime characteristics of the both-direction emission type OLED are improved.

According to an embodiment of the present inventive concept, the organic layer may be independently patterned according to R, G, and B pixels. In this case, the luminous efficiency improvement layer may be formed in at least one region selected from regions corresponding to the R, G, and B pixels.

Hereinafter, the present inventive concept may be described in detail with reference to the attached drawings. However, the present invention is not limited to the embodiments to be described hereinafter and can be embodied in various forms.

FIG. 1 is a sectional view of a top emission-type OLED according to an embodiment of the present inventive concept. Referring to FIG. 1, a reflective layer forming material and a first electrode forming material are sequentially deposited on a substrate 600 having a predetermined structure.

Examples of the reflective layer forming material include silver (Ag) having a relatively high reflection rate, and a silver (Ag) alloy including silver (Ag) and at least one material selected from samarium (Sm), tebium (Tb), gold (Au) and copper (Cu). The reflective layer forming material may be deposited to a thickness of 500 to 1200 Å to form a reflective layer. Examples of the first electrode forming material include indium tin oxide (ITO), IZO and $In_2O_3$. The first electrode forming material may be deposited to a thickness of 50 to 130 Å to form a transparent conductive layer.

Then, a photolithography process is performed on the resultant structure using a mask. As a result, a first electrode 500 including the reflective layer and the transparent conductive layer sequentially disposed (not shown) is completely formed.

Then, an organic layer 400 is disposed on the first electrode 500.

The organic layer 400 includes an organic emitting layer, and optionally one or more additional organic layers such as a hole injection layer, hole transport layer, a hole blocking layer, an electron transport layer, an electron injection layer, and the like. For example, if the first electrode 500 is an anode, the organic layer 400 may include a stack structure including a hole injection layer, a hole transport layer, an organic emitting layer, an electron transport layer, and an electron injection layer.

The organic emitting layer may include a small molecular material or a polymer. Examples of the small molecular material include tris(8-hydroxyquinoline)aluminum (Alq3), anthracene, cyclo pentadiene, bis(10-hydroxyben-zo[h]quinolinato)beryllium (BeBq2), tris (4-methyl-8-quinolinolato) aluminum (III) (Almq3), zinc bis-(2-(o-hydroxypheyl)-benzoxazolate)) (ZnPBO), aluminum (III) bis(2-methyl-8-quinolinate)-4-phenylphenolate (Balq), 4,4'-bis(2,2-diphenylvinyl)biphenyl (DPVBi), styrylanthracene derivative (BSA-2), and 1,2-bis(1-methyl-2,3,4,5-tetraphenyl silacyclopentadienyl)ethane) (2PSP). For example, the small molecular material may be Alq3. Examples of the polymer material include polyphenylene (PPP) and derivatives thereof, poly(p-phenylenevinylene) (PPV) and derivatives thereof, and polythiophene (PT) and derivatives thereof.

The hole injection layer may include any one material selected from copper phthalocyanine copper (CuPc), polyethylenedioxythiophene (PEDOT), 4,4',4"-tris{N,-(3-methylphenyl)-N-phenylamino}triphenylamine (m-MTDATA), and triphenylamine. The hole transport layer may include at least one hole transporting compound. For example, the hole transport layer may include aromatic tertiary amine. The aromatic tertiary amine is a compound containing at least one trivalent nitrogen atom bound only to carbon atoms and at least one of the carbon atoms is a carbon atom of aromatic ring. The aromatic tertiary amine may be: arylamine, such as monoarylamine, diarylamine, or triarylamine; or a polymerizable arylamine.

An electron transport layer may be formed of an electron transporting material, such as a metallic chelated auxinoide compound containing a chelate of auxin. The chelate of auxin is conventionally referred to as 8-quinolinol or 8-hydroxyquinoline. The metallic chelated auxinoide compound containing a chelate of auxin helps electrons enter and transport the electrons, has a high electron transporting capability, and easily formed in a thin film structure. Other examples of the electron transporting material include a butadiene derivative, a heterocyclic optical brightener, benzazole, and triazine. For the emitting layer, when a dopant is used to form the emitting layer, Alq3 is widely used as a host material of the emitting layer due to its electron transporting capability. For the electron injection layer, examples of an electron injection layer forming material include lithium fluoride, liquid quinolate, cesium fluoride, and sodiumquinolate.

Subsequently, a second electrode 300 is formed on the resultant structure including the organic layer 400.

The second electrode 300 may be a thin and light-transmissive transparent electrode. A second electrode forming material may be ITO or IZO, or a material having a low work function, such as Mg, Ag, Al, Ca or alloys thereof. For example, the second electrode forming material is MgAg.

Then, a luminous efficiency improvement layer 200 is formed on the second electrode 300, and then an encapsulation glass (not shown) is deposited on the luminous efficiency improvement layer 200, thereby completing the manufacture of the OLED. Herein, optionally, other layers may be further formed between the second electrode 300 and the luminous efficiency improvement layer 200. Therefore, in the specification and the claim section, the term "on" in the description of "disposed on" and the like includes position "over" as well as "in contact with". When the luminous efficiency improvement layer 200 is disposed on the second electrode 300, light having the same luminosity is more efficiently emitted outside the OLED. As a result, brightness of the OLED is relatively improved.

The luminous efficiency improvement layer 200 may include the porphyrazin derivative, the phthalocyanine derivative, the naphthalocyanine derivative or a combination of at least one compound of the foregoing, which have been described above. The thickness of the luminous efficiency improvement layer 200 may be 200 to 1500 Å, specifically 400 to 1000 Å. If the thickness of the luminous efficiency improvement layer 200 is less than 400 Å, luminosity of red light is reduced. On the other hand, if the thickness of the luminous efficiency improvement layer 200 is greater than 1000 Å, luminosity of blue light is reduced.

Figure 2:
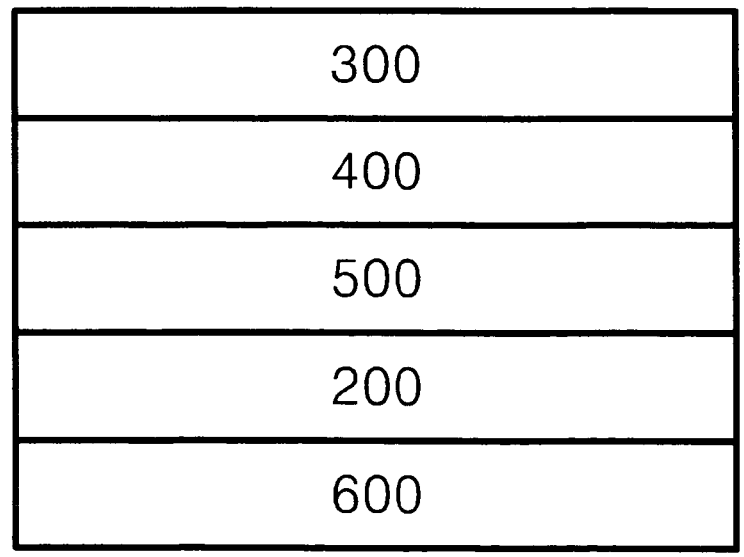
FIG. 2 is a sectional view of a bottom emission-type OLED according to an embodiment of the present inventive concept.

FIG. 2 is a sectional view of a bottom emission-type OLED according to an embodiment of the present inventive concept. Referring to FIG. 2, in the bottom emission-type OLED according to the current embodiment the luminous efficiency improvement layer is formed on a surface of the first electrode facing away from the organic layer. Like the top emission-type OLED, if necessary, other layers may be further formed between the luminous efficiency improvement layer 200 and the first electrode.

Figure 3:
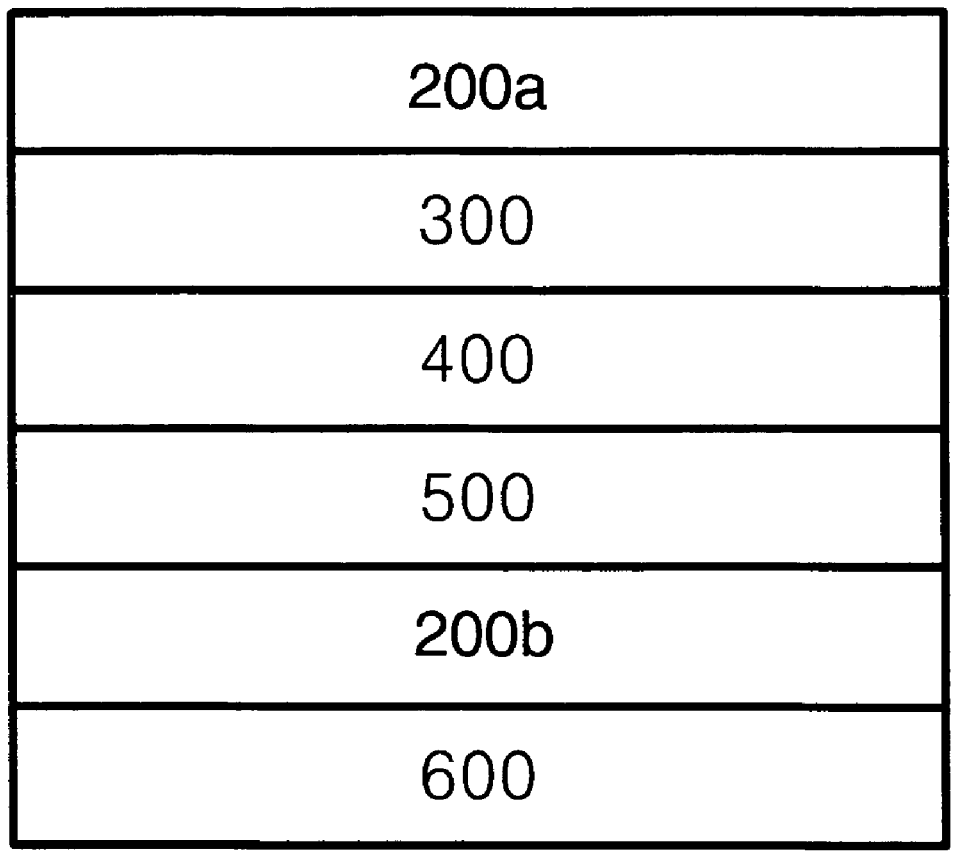
FIG. 3 is a sectional view of a both-direction emission-type OLDE according to an embodiment of the present inventive concept.

FIG. 3 is a sectional view of a both-direction emission-type OLDE according to an embodiment of the present inventive concept. Referring to FIG. 3, in the both-direction emission-type OLDE according to the current embodiment, the luminous efficiency improvement layers 200a and 200b are formed on the surfaces of the first and second electrodes facing away from the organic layer. Like in the case of the top or bottom emission-type OLED, if necessary, other layers may be further formed between the luminous efficiency improvement layer 200b and the first electrode 500 or between the luminous efficiency improvement layer 200a and the second electrode 300.

According to an embodiment of the present inventive concept, a thickness of a luminous efficiency improvement layer may be the same or different according to R, G, and B pixels.

The present inventive concept will be described in further detail with reference to the following examples. These examples are for illustrative purposes only and not intended to limit the scope of the present inventive concept.

EXAMPLE 1

The compound represented by Formula 5 was vacuum deposited on a substrate to form a luminous efficiency improvement layer having a thickness of 600 Å. Separately, 15 Ω/cm² (1200 Å) ITO glass substrate produced by Corning Co. was cut to a size of 50 mm×50 mm×0.7 mm, and then the cut ITO glass substrate was sonicated with isopropyl alcohol and pure water each for 5 minutes and then washed with ultra violet (UV) ozone for 30 minutes, thereby preparing an anode. The anode was placed on the luminous efficiency improvement layer. Then, m-MTDATA was vacuum deposited on the luminous efficiency improvement layer to form a hole injection layer having a thickness of 750 Å, and then α-NPD was vacuum deposited on the hole injection layer to form a hole transport layer having a thickness of 150 Å. Then, 97 wt. % of DSA functioning as a host and 3 wt. % of TBPe functioning as a dopant were deposited on the hole transport layer to form an emitting layer having a thickness of 300 Å. Then, Alq3 was vacuum deposited on the emitting layer to form an electron transport layer having a thickness of 200 Å. LiF was vacuum deposited on the electron transport layer to form an electron injection layer having a thickness of 80 Å and then, Al was vacuum deposited on the electron transport layer to form a cathode having a thickness of 3000 Å, thereby completing the manufacture of an OLED.

For the OLED, the driving voltage was 4.5 V at the current density of 10 A/cm², a color coordinate was 0.14, 0.18, and the luminous efficiency was 2.4 cd/A.

EXAMPLE 2

An OLED was manufactured in the same manner as in Example 1, except that the compound represented by Formula 8 was used instead of the compound represented by Formula 5.

For the OLED, the driving voltage was 4.5 V at the current density of 10 A/cm², a color coordinate was 0.14, 0.18, and the luminous efficiency was 2.6 cd/A.

COMPARATIVE EXAMPLE 1

An OLED was manufactured in the same manner as in Example 1, except that CuPc was used instead of the compound represented by Formula 5.

For the OLED, the driving voltage was 4.5 V at the current density of 10 A/cm², a color coordinate was 0.14, 0.18, and the luminous efficiency was 2.0 cd/A.

COMPARATIVE EXAMPLE 2

An OLED was manufactured in the same manner as in Example 1, except that Alq₃ was used instead of the compound represented by Formula 5.

For the OLED, the driving voltage was 4.5 V at the current density of 10 A/cm², a color coordinate was 0.14, 0.18, and the luminous efficiency was 2.1 cd/A.

Table 1 shows the compounds used to form a luminous efficiency improvement layer, driving voltages, color coordinates, luminous efficiencies of the OLEDs prepared according to Examples 1 and 2 and Comparative Examples 1 and 2

TABLE 1

|  | Compound | Thickness of luminous efficiency improvement layer | Driving voltage at current density of 10 mA/cm² | Color coordinate | Luminous efficiency cd/A |
| --- | --- | --- | --- | --- | --- |
| Example 1 | Compound represented by Formula 5 | 600 Å | 4.5 | 0.14, 0.18 | 2.4 |
| Example 2 | Compound represented by Formula 8 | 600 Å | 4.5 | 0.14, 0.18 | 2.6 |
| Comparative Example 1 | CuPc | 600 Å | 4.5 | 0.14, 0.18 | 2.0 |
| Comparative Example 2 | AlQ3 | 600 Å | 4.5 | 0.14, 0.18 | 2.1 |

While the present inventive concept has been particularly shown and described with reference to exemplary embodiments thereof, it will be understood by those of ordinary skill in the art that various changes in form and details may be made therein without departing from the spirit and scope of the present inventive concept as defined by the following claims.

What is claimed is:

1. An organic light emitting diode comprising:

a substrate;

a first electrode disposed on the substrate, the first electrode having a first surface facing the substrate and a second surface opposite to the first surface of the first electrode;

an organic layer disposed on the first electrode;

a second electrode disposed on the organic layer, the second electrode having a first surface facing the organic layer and a second surface opposite to the first surface of the second electrode; and a luminous efficiency improvement layer disposed on at least one surface of the first surface of the first electrode and the second surface of the second electrodes, the luminous efficiency improvement layer comprising a compound selected from the group consisting of a porphyrazin derivative, a phthalocyanine derivative, a naphthalocyanine derivative, and combinations of at least two compounds of the foregoing, wherein the phthalocyanine derivative is represented by Formula 2;

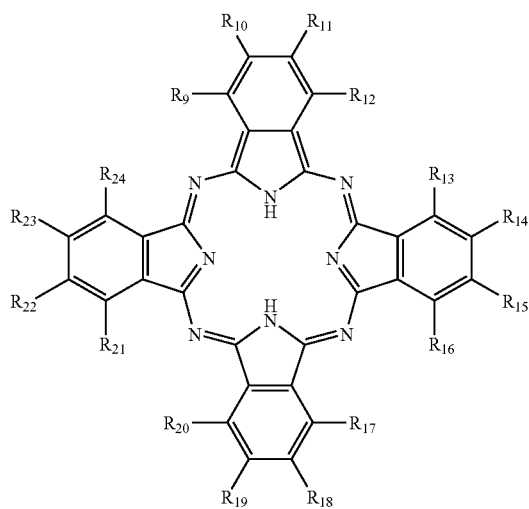

where $R_9$ through $R_{24}$ are each independently a hydrogen atom, a halogen atom, a hydroxyl group, a cyano group, a substituted or unsubstituted $C_1$-$C_{30}$ alkyl group, a substituted or unsubstituted $C_1$-$C_{30}$ alkoxy group, a substituted or unsubstituted $C_1$-$C_{30}$ acyl group, a substituted or unsubstituted $C_2$-$C_{30}$ alkenyl group, a substituted or unsubstituted $C_2$-$C_{30}$ alkynyl group, a substituted or unsubstituted $C_6$-$C_{30}$ aryl group, or a substituted or unsubstituted $C_3$-$C_{30}$ hetero aryl group.

2. The organic light emitting diode of claim 1, wherein the luminous efficiency improvement layer comprises the porphyrazin derivative, and the porphyrazin derivative is represented by Formula 1:

[Formula 1]

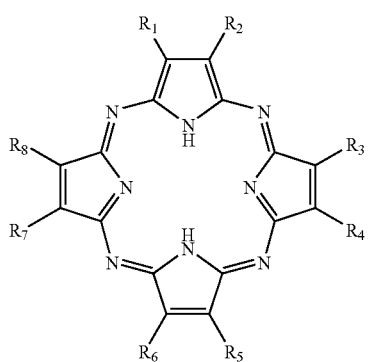

where $R_1$ through $R_8$ are each independently a hydrogen atom, a halogen atom, a hydroxyl group, a cyano group, a substituted or unsubstituted $C_1$-$C_{30}$ alkyl group, a substituted or unsubstituted $C_1$-$C_{30}$ alkoxy group, a substituted or unsubstituted $C_1$-$C_{30}$ acyl group, a substituted or unsubstituted $C_2$-$C_{30}$ alkenyl group, a substituted or unsubstituted $C_2$-$C_{30}$ alkynyl group, a substituted or unsubstituted $C_6$-$C_{30}$ aryl group, or a substituted or unsubstituted $C_3$-$C_{30}$ hetero aryl group.

3. The organic light emitting diode of claim 2, wherein the $R_1$ through $R_8$ are each independently a hydrogen atom, a halogen atom, a hydroxyl group, a cyano group, a substituted or unsubstituted $C_1$-$C_{10}$ alkyl group, a substituted or unsubstituted $C_1$-$C_{10}$ alkoxy group, a substituted or unsubstituted $C_1$-$C_{10}$ acyl group, a substituted or unsubstituted $C_2$-$C_{10}$ alkenyl group, a substituted or unsubstituted $C_2$-$C_{10}$ alkynyl group, a substituted or unsubstituted $C_6$-$C_{10}$ aryl group, or a substituted or unsubstituted $C_3$-$C_{10}$ hetero aryl group.

4. The organic light emitting diode of claim 1, wherein the luminous efficiency improvement layer comprises the phthalocyanine derivative, and the phthalocyanine derivative is represented by Formula 2:

[Formula 2]

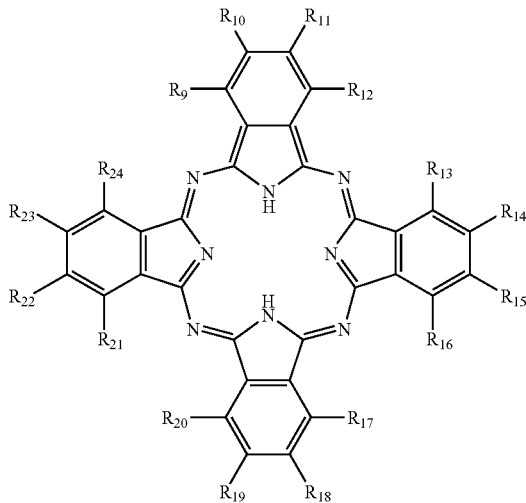

where $R_9$ through $R_{24}$ are each independently a hydrogen atom, a halogen atom, a hydroxyl group, a cyano group, a substituted or unsubstituted $C_1$-$C_{30}$ alkyl group, a substituted or unsubstituted $C_1$-$C_{30}$ alkoxy group, a substituted or unsubstituted $C_1$-$C_{30}$ acyl group, a substituted or unsubstituted $C_2$-$C_{30}$ alkenyl group, a substituted or unsubstituted $C_2$-$C_{30}$ alkynyl group, a substituted or unsubstituted $C_6$-$C_{30}$ aryl group, or a substituted or unsubstituted $C_3$-$C_{30}$ hetero aryl group.

5. The organic light emitting diode of claim 4, wherein $R_9$ through $R_{24}$ are each independently a hydrogen atom, a halogen atom, a hydroxyl group, a cyano group, a substituted or unsubstituted $C_1$-$C_{10}$ alkyl group, a substituted or unsubstituted $C_1$-$C_{10}$ alkoxy group, a substituted or unsubstituted $C_1$-$C_{10}$ acyl group, a substituted or unsubstituted $C_2$-$C_{10}$ alkenyl group, a substituted or unsubstituted $C_2$-$C_{10}$ alkynyl group, a substituted or unsubstituted $C_6$-$C_{10}$ aryl group, or a substituted or unsubstituted $C_3$-$C_{10}$ hetero aryl group.

6. The organic light emitting diode of claim 1, wherein the luminous efficiency improvement layer comprises the naphthalocyanine derivative, and the naphthalocyanine derivative is represented by Formula 3:

[Formula 3]

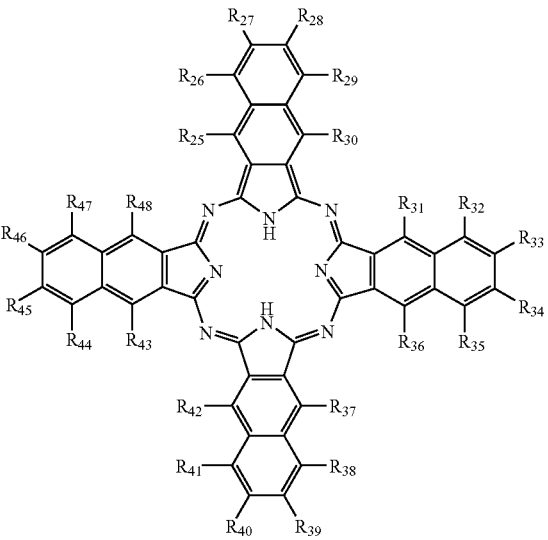

where $R_{25}$ through $R_{48}$ are each independently a hydrogen atom, a halogen atom, a hydroxyl group, a cyano group, a substituted or unsubstituted $C_1$-$C_{30}$ alkyl group, a substituted or unsubstituted $C_1$-$C_{30}$ alkoxy group, a substituted or unsubstituted $C_1$-$C_{30}$ acyl group, a substituted or unsubstituted $C_2$-$C_{30}$ alkenyl group, a substituted or unsubstituted $C_2$-$C_{30}$ alkynyl group, a substituted or unsubstituted $C_6$-$C_{30}$ aryl group, or a substituted or unsubstituted $C_3$-$C_{30}$ hetero aryl group, wherein two or more neighboring substituents selected from $R_{25}$ through $R_{48}$ are optionally bound to each other to form a saturated or unsaturated ring.

7. The organic light emitting diode of claim 6, wherein $R_{25}$ through $R_{48}$ are each independently a hydrogen atom, a halogen atom, a hydroxyl group, a cyano group, a substituted or unsubstituted $C_1$-$C_{10}$ alkyl group, a substituted or unsubstituted $C_1$-$C_{10}$ alkoxy group, a substituted or unsubstituted $C_1$-$C_{10}$ acyl group, a substituted or unsubstituted $C_2$-$C_{10}$ alkenyl group, a substituted or unsubstituted $C_2$-$C_{10}$ alkynyl group, a substituted or unsubstituted $C_6$-$C_{10}$ aryl group, or a substituted or unsubstituted $C_3$-$C_{10}$ hetero aryl group.

8. The organic light emitting diode of claim 1, wherein the porphyrazin derivative is one or more compounds selected from the compounds represented by Formulae 4 through 7:

[Formula 4]

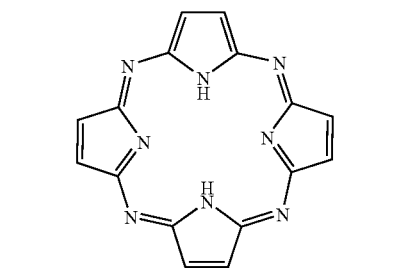

[Formula 5]

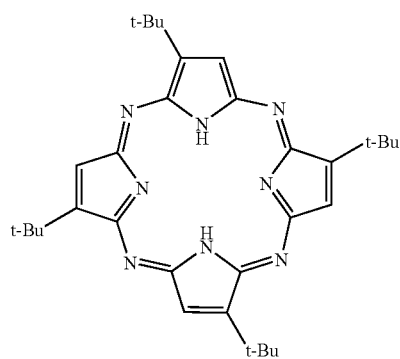

[Formula 6]

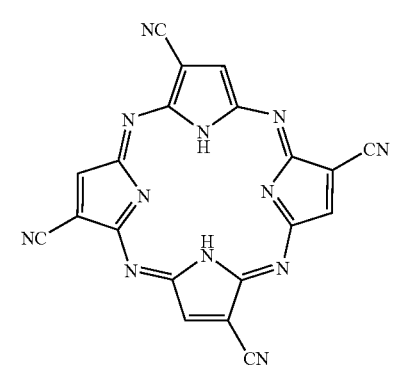

[Formula 7]

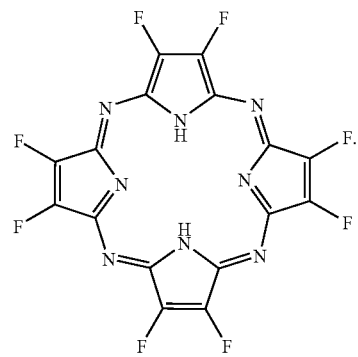

9. The organic light emitting diode of claim 1, wherein the phthalocyanine derivative is one or more compounds selected from the compounds represented by Formulae 8 through 13:

[Formula 8]

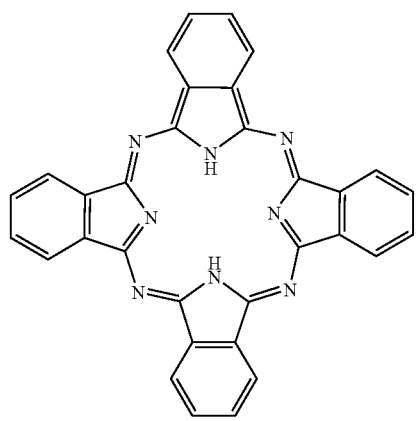

[Formula 9]

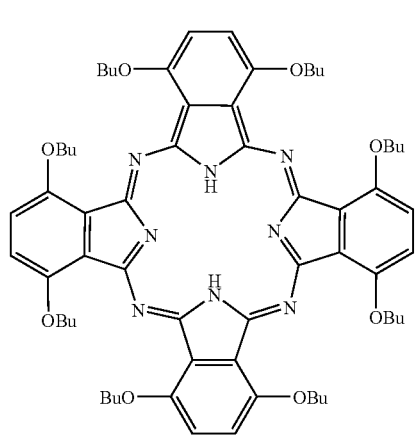

[Formula 10]
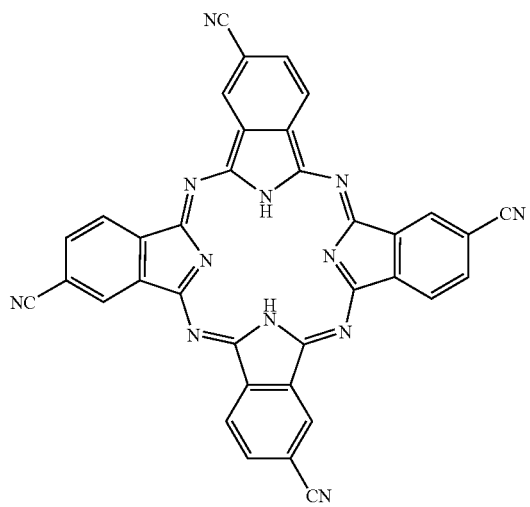
[Formula 11]
[Formula 12]
[Formula 13]
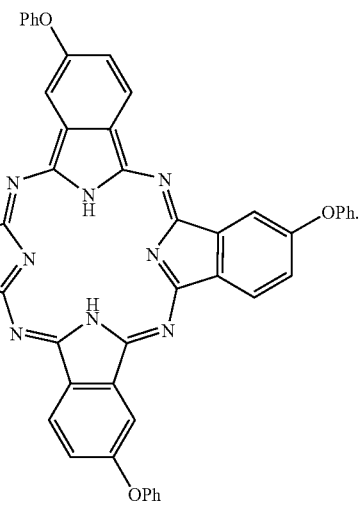
10. The organic light emitting diode of claim 1, wherein the naphthalocyanine derivative is one or more compounds selected from the compounds represented by Formulae 14 through 17:
[Formula 14]
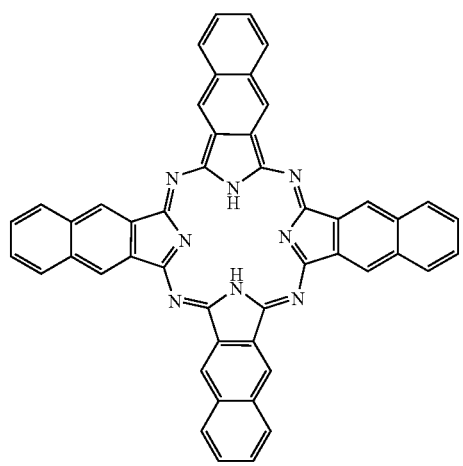
[Formula 15]
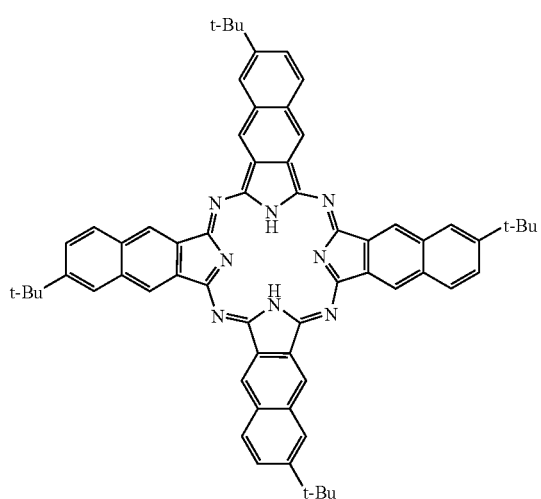

-continued

[Formula 16]

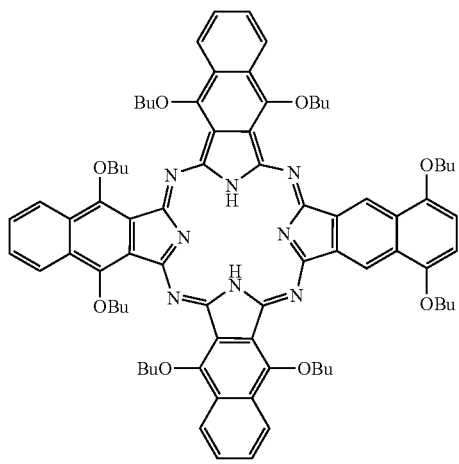

[Formula 17]

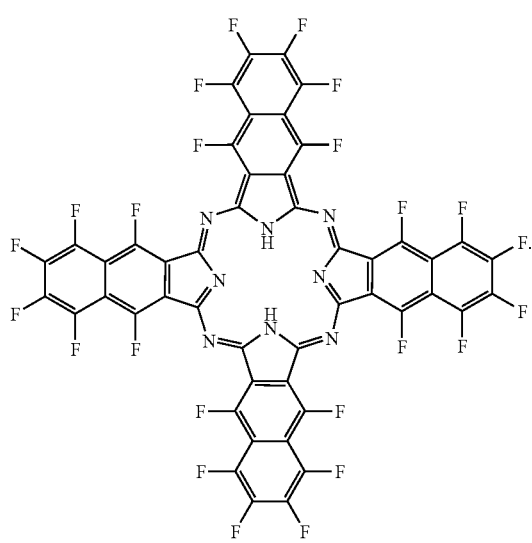

11. The organic light emitting diode of claim 1, wherein the first electrode is a reflective electrode and the second electrode is a transmissive electrode.

12. The organic light emitting diode of claim 1, wherein the second electrode is a reflective electrode and the first electrode is a transmissive electrode.

13. The organic light emitting diode of claim 1, wherein the first electrode and the second electrode are transmissive electrodes.

14. The organic light emitting diode of claim 1, wherein the organic layer is patterned according to R, G, and B pixels.

15. The organic light emitting diode of claim 14, wherein the luminous efficiency improvement layer is formed on at least one region selected from regions corresponding to the R, G, and B pixels.

16. An organic light emitting diode comprising:
a substrate;
a first electrode disposed on the substrate, the first electrode being a transmissive electrode;
a second electrode facing the first electrode;
an organic layer disposed between the first electrode and the second electrode; and
a first luminous efficiency improvement layer disposed between the first electrode and the substrate, the first luminous efficiency improvement layer comprising a first compound selected from the group consisting of a porphyrazin derivative represented by Formula 1, a phthalocyanine derivative represented by Formula 2, a naphthalocyanine derivative represented by Formula 3, and combinations of at least two compounds of the foregoing:

[Formula 1]

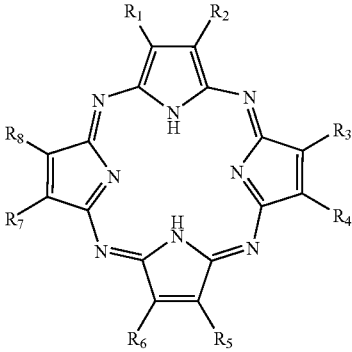

[Formula 2]

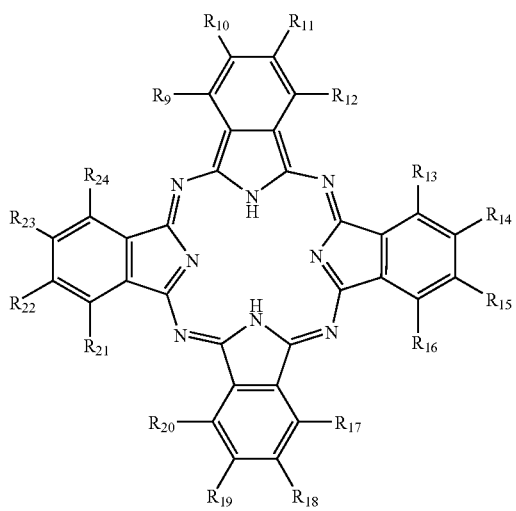

[Formula 3]

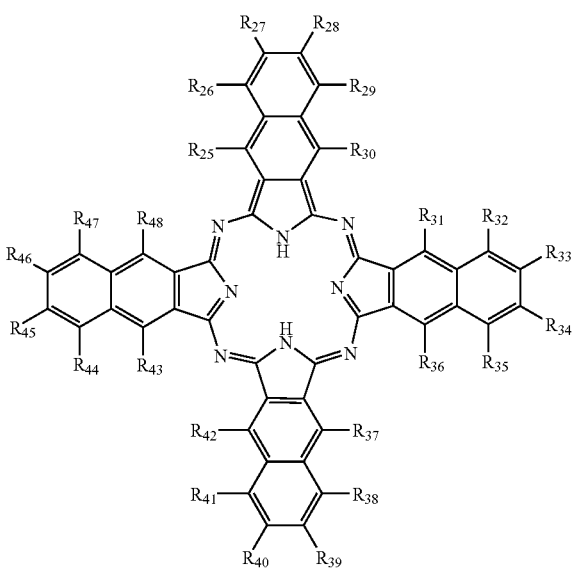

where $R_1$ through $R_{48}$ are each independently a hydrogen atom, a halogen atom, a hydroxyl group, a cyano group, a substituted or unsubstituted $C_1$-$C_{30}$ alkyl group, a substituted or unsubstituted $C_1$-$C_{30}$ alkoxy group, a substituted or unsubstituted $C_1$-$C_{30}$ acyl group, a substituted or unsubstituted $C_2$-$C_{30}$ alkenyl group, a substituted or unsubstituted $C_2$-$C_{30}$ alkynyl group, a substituted or unsubstituted $C_6$-$C_{30}$ aryl group, or a substituted or unsubstituted $C_3$-$C_{30}$ hetero aryl group.

17. The organic light emitting diode of claim 16, wherein the second electrode is a reflective electrode.

18. The organic light emitting diode of claim 16, wherein the second electrode is a transmissive electrode.

19. The organic light emitting diode of claim 18, further comprising a second luminous efficiency improvement layer disposed on the second electrode in a direction facing away from the organic layer, the second luminous efficiency improvement layer comprising a second compound selected from the group consisting of the porphyrazin derivative represented by Formula 1, the phthalocyanine derivative represented by Formula 2, the naphthalocyanine derivative represented by Formula 3, and combinations of said at least two compounds of Formula 1, Formula 2 and Formula 3.

20. An organic light emitting diode comprising:

a substrate;

a reflective electrode disposed on the substrate;

a transmissive electrode facing the reflective electrode;

an organic layer disposed between the reflective electrode and the transmissive electrode; and a luminous efficiency improvement layer disposed on the transmissive electrode in the direction facing away from the organic layer, the luminous efficiency improvement layer comprising a compound selected from the group consisting of a porphyrazin derivative represented by Formula 1, a phthalocyanine derivative represented by Formula 2, a naphthalocyanine derivative represented by Formula 3, and combinations of at least two compounds of the foregoing:

[Formula 1]

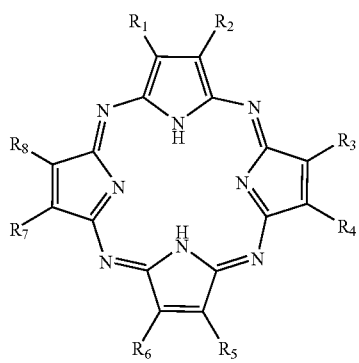

[Formula 2]

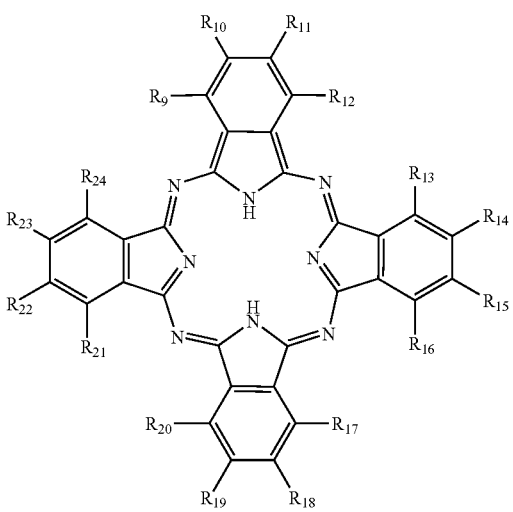

[Formula 3]

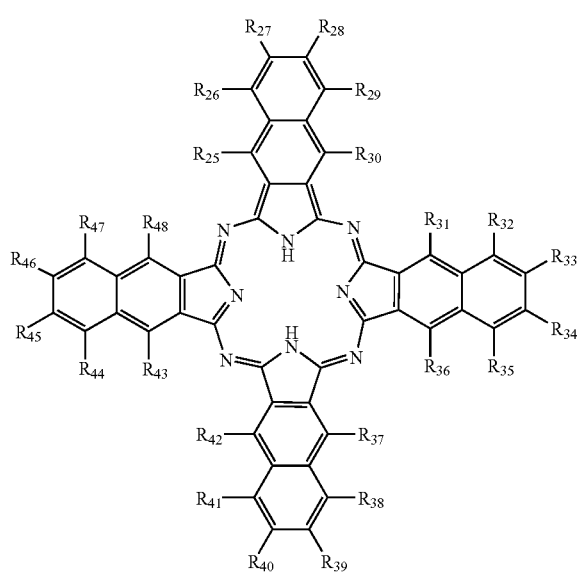

where $R_1$ through $R_{48}$ are each independently a hydrogen atom, a halogen atom, a hydroxyl group, a cyano group, a substituted or unsubstituted $C_1$-$C_{30}$ alkyl group, a substituted or unsubstituted $C_1$-$C_{30}$ alkoxy group, a substituted or unsubstituted $C_1$-$C_{30}$ acyl group, a substituted or unsubstituted $C_2$-$C_{30}$ alkenyl group, a substituted or unsubstituted $C_2$-$C_{30}$ alkynyl group, a substituted or unsubstituted $C_6$-$C_{30}$ aryl group, or a substituted or unsubstituted $C_3$-$C_{30}$ hetero aryl group.

* * * * *